United States Patent [19]

Toyoda et al.

[11] Patent Number: 4,518,871
[45] Date of Patent: May 21, 1985

[54] GA/AS NOR/NAND GATE CIRCUIT USING ENHANCEMENT MODE FET'S

[75] Inventors: Nobuyuki Toyoda; Akimichi Hojo, both of Yokohama, Japan

[73] Assignee: Tokyo Shibaura Denki Kabushiki Kaisha, Kawasaki, Japan

[21] Appl. No.: 449,997

[22] Filed: Dec. 15, 1982

[30] Foreign Application Priority Data

Dec. 26, 1981 [JP] Japan ................................ 56-214911

[51] Int. Cl.³ ................ H03K 19/003; H03K 19/094; H03K 19/20
[52] U.S. Cl. .................................... 307/443; 307/448; 307/450; 307/550
[58] Field of Search ........ 307/443, 445, 453, 448-450, 307/440, 442, 446, 468, 469, 550; 364/716

[56] References Cited

U.S. PATENT DOCUMENTS 4,038,563 7/1977 Zuleeg et al. ...................... 307/450
4,405,870 9/1983 Eden ............................... 307/450 X
4,417,162 11/1983 Keller et al. ..................... 307/450 X

FOREIGN PATENT DOCUMENTS 0041415 9/1981 European Pat. Off. .

OTHER PUBLICATIONS

IEEE Trans Electron Device, vol. ED-27, No. 6, 1974 (1980), pp. 1074-1091, Lehovee et al., "Analysis of GaAs FET'for Integrated Logic".
Nachrichtentechnik Elektronik, vol. 31, No. 2, J. Herzog, "Monolithisch Galliumarsenid-Basis, Teil 1,", pp. 48-52.

Primary Examiner—Stanley D. Miller
Assistant Examiner—D. R. Hudspeth
Attorney, Agent, or Firm—Oblon, Fisher, Spivak, McClelland & Maier

[57] ABSTRACT

In an integrated logic circuit employing normally-off type FET's, it is difficult, but desirable to realize a NAND gate due to unwanted flow of the forward current to the next stage.

In accordance with the invention, a stable NAND gate operation can be realized by introducing a NOR gate into all gate electrodes of the inputs of the NAND gate, except one gate electrode thereof of which source is grounded.

12 Claims, 10 Drawing Figures

NORMALLY-OFF TYPE
FET INVERTER

NORMALLY-OFF TYPE
FET NOR GATE

NAND / INVERTER
GATE (PRIOR ART)

F I G. 5A
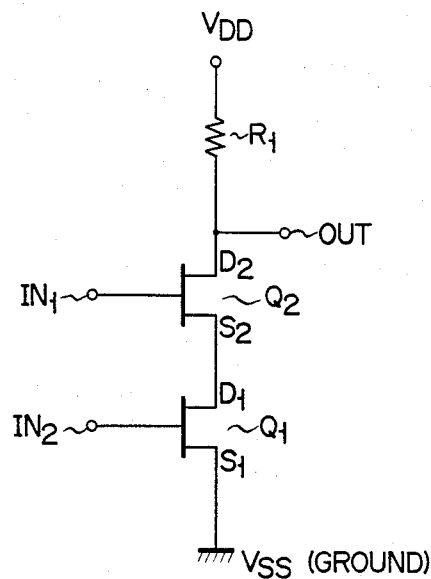
F I G. 5B
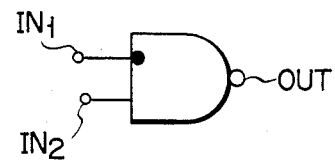
F I G. 6
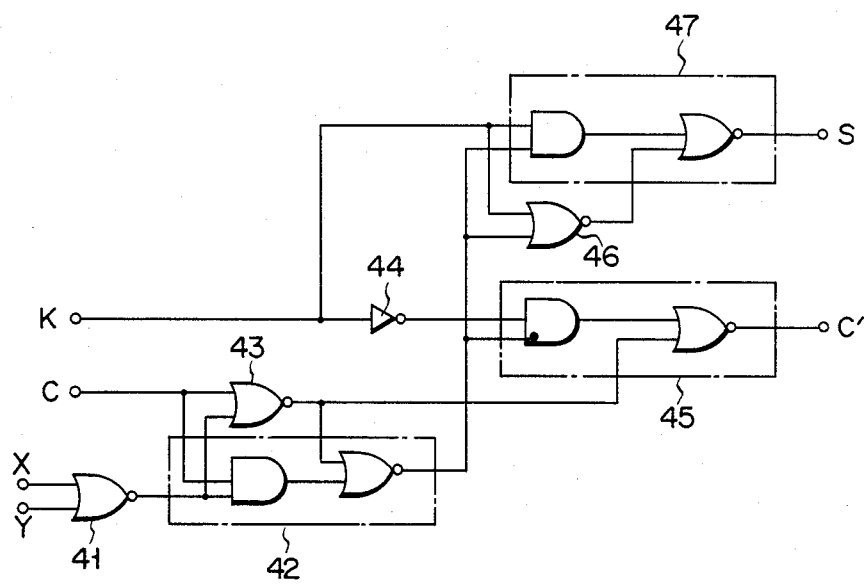

GA/AS NOR/NAND GATE CIRCUIT USING ENHANCEMENT MODE FET'S

BACKGROUND OF THE INVENTION

1. Field of the Invention

This invention relates to an integrated logic circuit employing normally-off type field effect transistors such as metal Schottky-barrier-gate FET's (Si MESFET's and compound MESFET's) and junction gate FET's (JFET's).

An integrated logic circuit employing GaAs FET's is receiving a great deal of attention as a high-speed data processing IC. Basic logic gate circuits employing GaAs FET's include those which use normally-on type GaAs FET's and those which use normally-off type GaAs FET's. Although circuits of the latter category involve difficult manufacturing procedures, they can be realized by the simplest configuration. The latter logic circuits are therefore expected to realize an highly integrated logic circuit employing GaAs FET's.

Meanwhile most basic logic gates of an integrated logic circuit are NOR gates and NAND gates. A complex logic function is realized with a silicon logic IC by arbitrarily combining these NOR and NAND gates. On the other hand, an integrated logic circuit employing normally-on type GaAs FET's consists of NOR gates but rarely of NAND gates. This does not imply that NAND gates are unnecessary, but the configuration of the NAND gates causes some difficulty, details of which will be described hereinafter

2. Description of the Prior Art

An integrated logic circuit employing GaAs FET's generally comprises metal Schottky-barrier-gate FET's or Schottky-gate FET's (to be referred to as MESFET's hereinafter), or junction gate FET's (to be referred to as JFET's hereinafter). In an integrated logic circuit employing normally-off type GaAs FET's, these FET's are used with a positive bias voltage with respect to the source potential, applied to their gates, so that a forward current flows from their gates to the channels. FIGS. 1(A) and 1(B) show examples of an inverter and a NOR gate each using a normally-off type GaAs FET or FET's. In these circuits, when the logic level of an input is HIGH ("1"), a forward current may flow from the gate to a grounded source electrode. Accordingly the gate potential is clamped to the voltage determined by the rise voltage of this forward current (about 0.7 V in the case of a MESFET and about 1.2 V in the case of a JFET). If a NAND gate constructed by normally-off type MESFET's, Si MESFET's or JFET's, the following problem is encountered. FIG. 2 shows a NAND gate consisting of normally-off type FET's Q1 and Q2 and a resistor R1; and an inverter consisting of an FET Q3 and a resistor R2, this inverter being connected to receive an output from the NAND gate. In the NAND gate shown in FIG. 2, when the input logic level of the gate input terminal IN2 of the FET Q1 is LOW ("0") to turn it off, and when the logic level of the gate input terminal IN1 of the FET Q2 at the side of a power supply VDD is HIGH ("1") to turn it on, a forward current I1 of the gate input terminal IN1 is not allowed to flow into the source of the FET Q1 since it turns OFF. However, in the actual circuit, since the output of the NAND gate is connected to the gate input terminal of the inverter as the next stage, the forward current I1 practically flows to the FET Q3 through a drain electrode D2 of the FET Q2. At this time, current I1, I2 and I3 may flow to the FET Q3, as illustrated in the figure.

In general the MESFET comprises, as shown in FIG. 3, a gate electrode 16 for defining a Schottky contact 14 with the surface of an active layer 12 formed on a substrate 10, and a source electrode 18 and a drain electrode 20 for defining ohmic contact with the layer 12. Since the active layer 12 is very thin, a considerably large series resistance Rs is present, as schematically shown in FIG. 3. Therefore, in the state of the circuit shown in FIG. 2, the effective source potential of the FET Q3 is given by $Rs \cdot (I1 + I2 + I3)$.

The potential of the source S3 of the FET Q3 (inverter) receiving signals from the output terminal of the NAND gate is further increased by the voltage defined by $Rs \cdot I1$, compared with in the case of sole NOR gate or inverter, rendering the holding of the "0" level difficult. For this reason, a NAND gate employing normally-off type GaAs FET's has not been used in an integrated logic circuit.

SUMMARY OF THE INVENTION

It is therefore an object of the present invention to eliminate the aforementioned conventional drawbacks and to provide an integrated logic circuit utilizing normally-off type field effect transistors.

To accomplish the object of the present invention, there is provided an integrated logic circuit which comprises:

a pair of power supply terminals of which one terminal is grounded;

(N−1) numbers of NOR gates including first normally-off type field effect transistors, of which sources are grounded; and a NAND gate having (N) numbers of second normally-off type field effect transistors, of which source-to-drain current paths are series-connected, at least one of all gate electrodes of said second field effect transistors being connected to the first input of the NAND gate, and the remaining gate electrodes thereof being connected to said respective NOR gate.

According to the present invention, the problem can be solved which is usually encountered when normally-off type field effect transistors are integrated to construct a NAND gate or an AND gate. That is, an undesirable increase in the logic level of a given stage due to the influx of the current from a previous stage can be prevented. Accordingly, stable logic operation of the IC is ensured.

BRIEF DESCRIPTION OF THE DRAWINGS

The invention is best understood by reference to the accompanying drawings, of which:

FIGS. 5A and 5B show one example of a NAND gate according to the present invention;

FIG. 6 shows a circuit diagram of a full adder employing the AND/NOR gates according to the present invention;

DETAILED DESCRIPTION OF THE PREFERRED EMBODIMENT

Figure 1A:
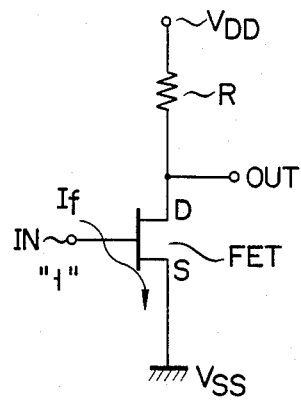
FIG. 1A shows a circuit diagram of an inverter comprising a normally-off type FET.
Figure 1B:
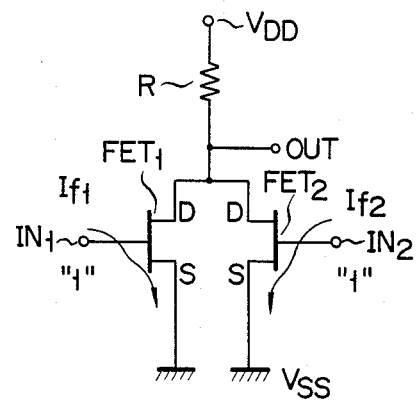
FIG. 1B shows a circuit diagram of a NOR gate comprising normally-off type FET's.
Figure 2:
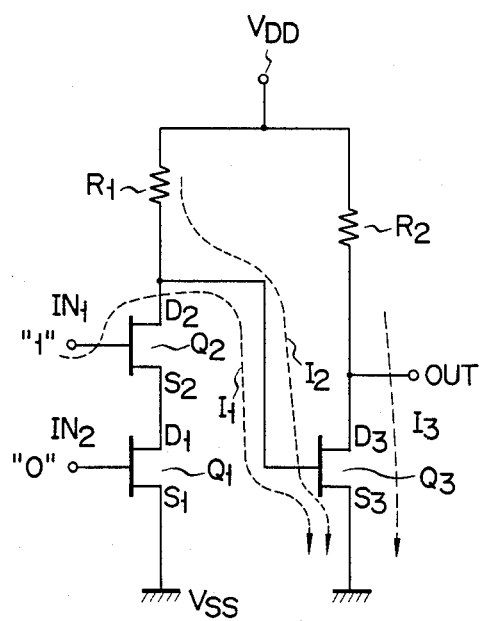
FIG. 2 shows a circuit diagram of a conventional NAND/INVERTER comprising GaAs FET's.
Figure 3:
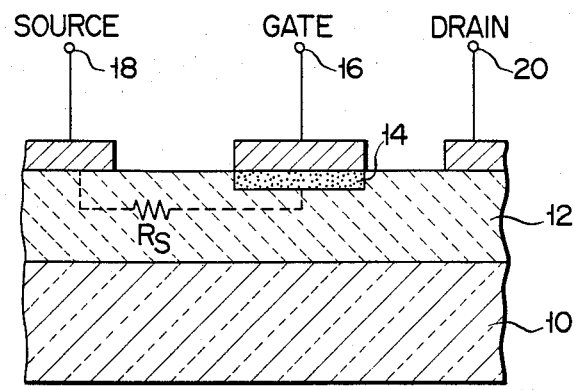
FIG. 3 shows schematically a cross-sectional view of a portion of a MESFET.
Figure 4:
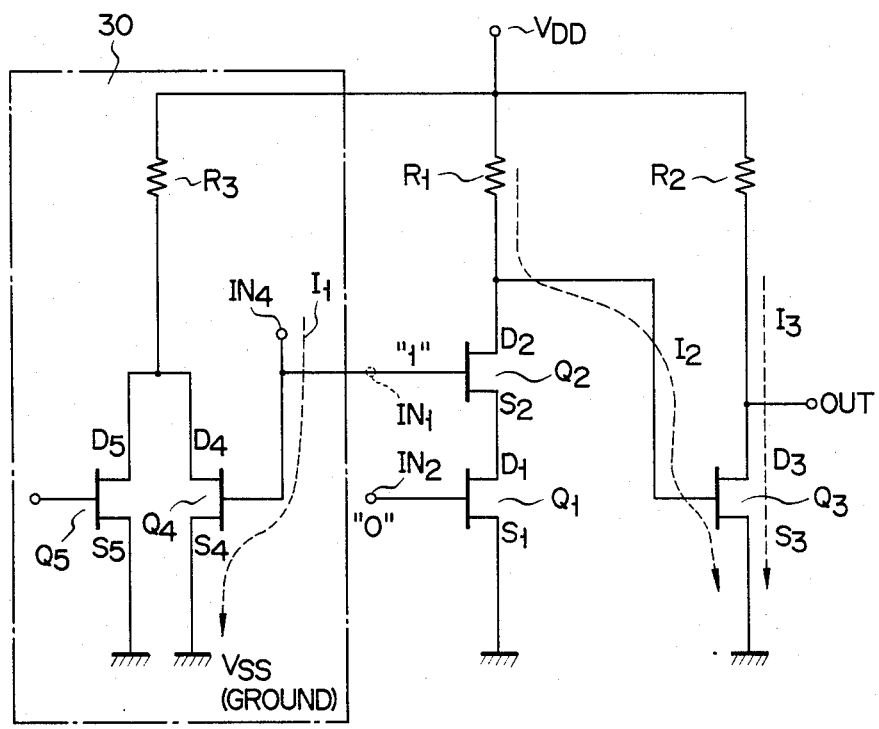
FIG. 4 shows a circuit diagram of one preferred embodiment.

FIG. 4 shows a circuit diagram of one preferred embodiment where the state of current flow in an integrated logic circuit employing GaAs FET's is illustrated comparing with FIG. 2.

It should be noted that the same reference numerals shown in FIG. 2 will be employed to denote the same circuit elements shown in the following figures.

In FIG. 4, the GaAs integrated logic circuit is constructed by a NOR gate 30, one gate of which is additionally connected to the conventional NAND/INVERTER as shown in FIG. 2. This NOR gate is constructed by a fourth FET Q4 of MESFET or JFET type, a fifth FET Q5, and a resistor R3, the source-to-drain current path of the fourth FET Q4 being connected parallel to that of the fifth FET Q5, and the resistor R3 being connected between one power supply terminal VDD and the node made between the drains D4 and D5 of the FET's Q4 and Q5, respectively. Then, an input terminal IN4 of the gate of the fourth FET Q4 is connected to the input terminal IN1 (now becomes IN4) of the gate of the second FET Q2, and both drains of the FET's Q4 and Q5 are connected to the other power supply terminal VSS (=ground).

A case will now be considered wherein the signal level of the input to the FET Q1 at the ground side (VSS) of the NAND gate is LOW ("0") while the signal level of the input to the FET Q2 at the power supply side (VDD) is HIGH ("1"). A current I1 supplied to the gate of the FET Q2 flows into the gate-to-source current path of the FET Q4 of the NOR gate 30 connected parallel to the FET Q2. As having been described with reference to FIG. 2, the current I1 may not flow into the next stage (=inverter Q3) through the gate of the FET Q2 via the drain thereof. Therefore, the source potential of the FET Q3 of the inverter of the next stage may not be undesirably increased, so that stable logic operation may be realized.

Now summarizing the embodiment just described, the NAND gate of the normally-off type logic IC can be realized by constructing the circuitry as shown in FIG. 4. That is, the gate of the second FET Q2 partially constructing the NAND gate, which is not connected to the ground (VSS), is connected to the gate of the fourth FET Q4 partially constructing the NOR gate, the source of the last-mentioned FET being connected to the ground (VSS) so as to by-pass the gate-forward current of the FET (Q2) through the gate-to-source path of the FET Q4.

It should be noted that a plurality of input terminals of the NAND gate (or the AND/NOR gate) in a normally-off type logic IC are not mutually equivalent in view of the gate connection, and those of the FET's constructing the NAND or AND/NOR gate at the ground side must be distinguished from those of the other FET's. Representation of the NAND gate as shown in FIG. 5(A) must therefore be given, for example, as shown in FIG. 5(B) in order to distinguish between the two input gates. The input terminal IN1 (indicated by a solid "dot") at the side of the one power supply terminal VDD (not the side of the ground) is necessarily connected in parallel with the input terminal of other NOR gate (not shown) or the inverter.

An example of a parallel multiplier will now be described, which is the integrated logic circuit employing normally-off type field effect transistors of the present invention.

A parallel multiplier is widely adopted as a basic logic arithmetic device and generally is categorized to a full adder and a half adder.

Although the half adder may be easily obtained from a combination of NOR gates and inverters, the full adder would have a considerably complex configuration if it were constructed by only these two types of logic gates. So if an AND/NOR gate can be used as one of modifications of the NAND gate, the full adder may be obtained with a smaller number of NAND (i.e., AND/NOR) gates as shown in FIG. 6. Referring to FIG. 6, all gates 41 to 47 are constructed by normally-off type MESFET's.

Input signals to be added together are supplied to two input terminals X and Y of a first NOR gate 41. The output terminal of this NOR gate 41 is connected to one AND input terminal of a first AND/NOR gate 42. The other AND input terminal of the first AND/NOR gate 42 is connected to one input terminal of a second NOR gate 43, which also receives a carry signal. The output terminal of the second NOR gate 43 is connected to one input terminal of a NOR gate of a second AND/NOR gate 45. A carry bit signal is produced from an output terminal C' of the second AND/NOR gate 45. One AND input terminal of a third AND/NOR gate 47 is connected to the input terminal of an inverter 44. The summation resulted from the previous stage (not shown) is supplied to a common connection terminal K. The other AND input terminal of the third AND/NOR gate 47 is connected to one input terminal of a third NOR gate 46, as well as to one AND input terminal of the second AND/NOR gate 45 and further to the output terminal of the first AND/NOR gate 42. The summation resulted from this full adder is produced from an output terminal S of the third AND/NOR gate 47.

Referring to FIG. 6, both AND input terminals of the first and third AND/NOR gates 42 and 47 are connected in parallel with the input terminal of the separate NOR gates 43 and 46 respectively. Under this condition, the previously explained forward current may not flow from the present stage to the next stage. However, one of the AND input terminals of the second AND/NOR gate 45 is connected in parallel with the NOR gate 46, while the other one is not. The present invention provides advantages in this condition. More specifically, the one AND input terminal (indicated by a solid "dot") of the second AND/NOR gate 45 at the side of the power supply is selected to be connected in parallel with the NOR gate 46 with respect to the ground. Then, when the one input terminal of the second AND/NOR gate 45 at the side of the power supply is at logic level "1", the forward current may be passed to the second NOR gate 46, so that the overall circuit may operate stably. To the contrary, if a full adder would not be wired in this manner, the forward current shall flow from the output terminal C' of the second AND/NOR gate 45 to the next stage (not shown), so that its logic level "0" will rise to from 0.2 to 0.3 V, which is approximately 0.1 V higher than the general logic level "0" voltage ($\lesssim 0.1$ V), resulting in error operation.

Figure 7:
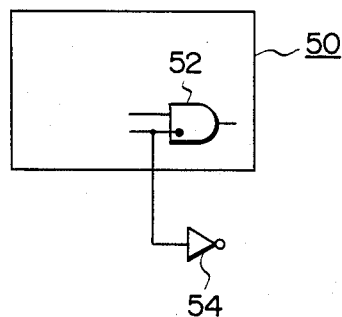
FIG. 7 schematically shows a diagram of a modification of the present invention.

In the full adder of the embodiment described above, the one AND input terminal (indicated by a solid "dot")

of the AND/NOR gate 45 at the side of the power supply is connected to the NOR gate 46 constructing its own IC to achieve the effect of the present invention. However, such wiring cannot be performed in some IC's for various reasons. In such a case, the present invention may be practiced by adding an inverter independently which has no relation to the original logic function of the IC. For example, as shown in FIG. 7, if one input terminal of an AND gate 52 at the side of the power supply in an integrated logic circuit 50 cannot be connected to the input terminal of another NOR gate (not shown) or an inverter (not shown) within this circuitry 50, an independent inverter 54 should be added to the circuitry 50. The input terminal in question of the AND gate 52 may then be connected to the input terminal of the inverter 54.

Figure 8:
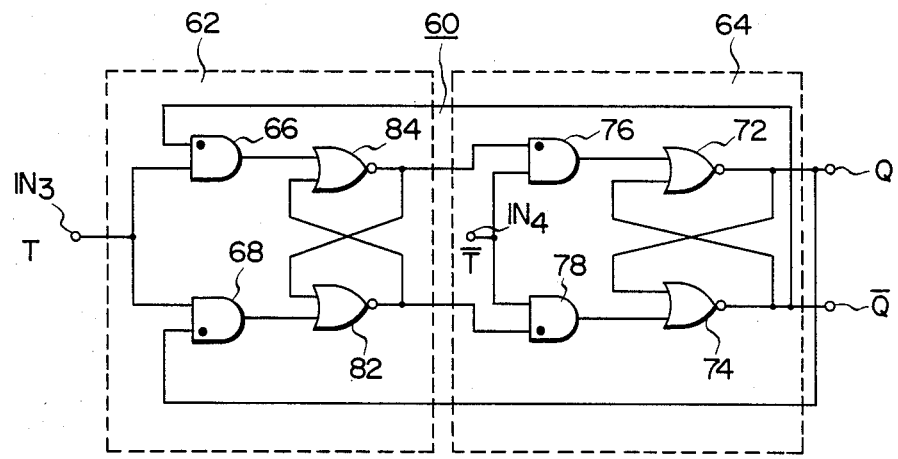
FIG. 8 shows a circuit diagram of a frequency divider circuit employing AND/NOR gates according to the present invention.

Referring to FIG. 8, there is shown a flip-flop logic circuit constituted as a frequency divider that employs two normally-off type AND/NOR gates according to the present invention. A flip-flop logic circuit 60 comprises a master portion 62 and a slave portion 64. In accordance with the principle of the invention, each one input terminal (indicated by a solid "dot") of AND gates 66 and 68 belonging to the master portion 62 is necessarily connected to the corresponding one input terminal of each of NOR gates 72 and 74 belonging to the slave portion 64 respectively. Similarly, each one input terminal (indicated by solid "dot") of AND gate 76 and 78 is necessary to be connected to the corresponding input terminal of each of NOR gates 82 and 84 respectively. A clock signal (T) is usually supplied to an input IN3 of the master portion 62 and an inverted clock signal ($\overline{T}$) is to an input IN4 of the slave portion 64. Accordingly, the aforementioned conventional drawbacks of the normally-off type NAND gate can be avoided by the circuit in FIG. 8.

It should be understood that the above-described embodiments are merely illustrative of the many possible specific embodiments which represent different applications of the principles of this invention. Numerous and various other arrangements can be devised in accordance with these principles by those skilled in the art without departing from the scope of the present invention.

For example, in the embodiment shown in FIG. 4, the NAND gate has only two input terminals. However, the present invention is not limited to this. The NAND gate may have 3 or more input terminals. In such a case, the input terminals of the respective gates excluding those of the FET whose source is grounded may be connected to corresponding separate NOR gates.

What we claim is:

1. A NOR/NAND gate circuit comprising:
   a NAND gate comprising at least first and second normally off type field effect transistors having source-to-drain current paths series-connected between a power source (VDD) and a ground potential (VSS) via a load, wherein the source of said first transistor is connected to ground potential and the gate thereof is connected to a first input terminal, and wherein the gate of said second transistor is connected to a second input terminal; and
   NOR gate means for bypassing a forward current which would otherwise pass through said NAND gate, comprising third and fourth normally-off field effect transistors having respective source-to-drain current paths connected to ground potential, wherein the gate electrode of one of said third and fourth transistors is connected to said second input terminal and to the gate electrode of said second transistor of said NAND gate.

2. A NOR/NAND gate circuit according to claim 1, further comprising:
   said NAND gate comprising a fifth normally-off type field effect transistor having a source-to-drain current path connected in series with that of said first and second transistors and a gate connected to a third terminal; and
   said NOR gate means comprising a respective normally-off field effect transistor associated with said fifth transistor, said respective transistor having a source connected to ground potential and a gate connected to said third terminal and the gate of said fifth transistor.

3. A NOR/NAND gate as claimed in claim 1, wherein said first, second, third and fourth normally-off type field effect transistors are metal Schottky-barrier gate field effect transistors.

4. A NOR/NAND gate as claimed in claim 1, wherein said first, second, third and fourth normally-off type field effect transistors are junction gate field effect transistors.

5. A NOR/NAND gate as claimed in claim 2, wherein said first, second, third, fourth, fifth and respective normally-off type field effect transistors are metal Schottky-barrier gate field effect transistors.

6. A NOR/NAND gate as claimed in claim 2, wherein said first, second, third, fourth, fifth and respective normally-off type field effect transistors are junction gate field effect transistors.

7. A NOR/NAND gate circuit comprising:
   a NAND gate comprising at least first and second normally off type field effect transistors having source-to-drain current paths series-connected between a power source (VDD) and a ground potential (VSS) via a load, wherein the source of said first transistor is connected to ground potential and the gate thereof is connected to a first input terminal, and wherein the gate of said second transistor is connected to a second input terminal; and
   AND/NOR gate means for bypassing a forward current which would otherwise pass through said NAND gate, comprising third and fourth normally-off field effect transistors having respective drain-to-source current paths connected to ground potential, wherein the gate electrode of one of said third and fourth transistors is connected to said second input terminal and to the gate electrode of said second transistor of said NAND gate.

8. A NOR/NAND gate circuit according to claim 7, further comprising:
   said NAND gate comprising a fifth normally-off type field effect transistor having a source-to-drain current path connected in series with that of said first and second transistors and a gate connected to a third terminal; and
   said AND/NOR gate means comprising a respective normally-off field effect transistor associated with said fifth transistor, said respective transistor having a source connected to ground potential and a gate connected to said third terminal and the gate of said fifth transistor.

9. A NOR/NAND gate as claimed in claim 7, wherein said first, second, third and fourth normally-off type field effect transistors are metal Schottky-barrier gate field effect transistors.

10. A NOR/NAND gate as claimed in claim 7, wherein said first, second, third and fourth normally-off type field effect transistors are junction gate field effect transistors.

11. A NOR/NAND gate as claimed in claim 8, wherein said first, second, third, fourth, fifth and respective normally-off type field effect transistors are metal Schottky-barrier gate field effect transistors.

12. A NOR/NAND gate as claimed in claim 8, wherein said first, second, third, fourth, fifth and respective normally-off type field effect transistors are junction gate field effect transistors.

* * * * *